United States Patent
Park et al.

(10) Patent No.: US 7,524,692 B2
(45) Date of Patent: Apr. 28, 2009

(54) METHOD OF PRODUCING NITRIDE LAYER AND METHOD OF FABRICATING VERTICAL STRUCTURE NITRIDE SEMICONDUCTOR LIGHT EMITTING DEVICE

(75) Inventors: Hee Seok Park, Kyungki-do (KR); Masayoshi Koike, Kyungki-do (KR); Kyeong Ik Min, Seoul (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 441 days.

(21) Appl. No.: 11/410,052

(22) Filed: Apr. 25, 2006

(65) Prior Publication Data

US 2006/0292718 A1      Dec. 28, 2006

(30) Foreign Application Priority Data

Apr. 26, 2005      (KR) .................... 10-2005-0034351

(51) Int. Cl.
*H01L 21/00* (2006.01)
(52) U.S. Cl. .................... 438/46; 438/22; 257/E21.121
(58) Field of Classification Search ............... 438/22, 438/46
See application file for complete search history.

(56) References Cited

U.S. PATENT DOCUMENTS

2004/0185643 A1* 9/2004 Chiyo et al. .................. 438/518
2006/0078024 A1* 4/2006 Matsumura et al. ...... 372/46.01

\* cited by examiner

*Primary Examiner*—Alexander G Ghyka
(74) *Attorney, Agent, or Firm*—McDermott Will & Emery LLP (57) ABSTRACT

The present invention provides methods for manufacturing a nitride layer and a vertical nitride semiconductor light emitting device. In manufacturing the nitride layer according to the invention, a sapphire substrate is prepared. A buffer layer made of a material having a melting point and a thermal conductivity higher than those of nitride is formed on the sapphire substrate. Also, the nitride layer is formed on the buffer layer. Then a laser beam is irradiated to an underside of the sapphire substrate to remove the nitride layer. According to the invention, the nitride layer is made of a material having a composition expressed by $Al_xIn_yGa_{(1-x-y)}N$, where $0 \leq x \leq 1$, $0 \leq y \leq 1$, and $0 \leq x+y \leq 1$. In addition, the buffer layer is made of SiC.

9 Claims, 12 Drawing Sheets

Prior art

METHOD OF PRODUCING NITRIDE LAYER AND METHOD OF FABRICATING VERTICAL STRUCTURE NITRIDE SEMICONDUCTOR LIGHT EMITTING DEVICE

CLAIM OF PRIORITY

This application claims the benefit of Korean Patent Application No. 2005-34351 filed on Apr. 26, 2005, in the Korean Intellectual Property Office, the disclosure of which is incorporated herein by reference.

BACKGROUND OF THE INVENTION

1. Field of the Invention

The present invention relates to a method for manufacturing a nitride layer and a method for fabricating a vertical nitride semiconductor light emitting device using the same. More particularly, the present invention relates to a method for manufacturing a nitride layer which releases heat generated in the decomposition of the nitride layer through a buffer layer and prevents heat-induced deterioration of the nitride layer by adjusting an intensity of a laser beam irradiated in a laser lift off (LLO) process after growth of the nitride layer on a sapphire substrate to remove the nitride layer at an interface between the nitride layer and a buffer layer, and a method for fabricating a vertical nitride semiconductor device using the same.

2. Description of the Related Art

Due to recent drastic developments in telecommunication technologies, communication techniques for high-speed and massive-capacity signal transmission have experienced a rapid development. Especially, with a rising demand for personal mobile phones, satellite communications, military radars, broadcasting communications and communication relays, there has been an increasing request for a high-speed, high-power electronic device which requires a high-speed telecommunication system of microwave band and millimeter wave band. In particular, a nitrogen compound (nitride) has a large energy gap, and exhibits superior physical properties such as a high thermal chemical stability and a high electronic saturation velocity. Therefore the nitride is easily applicable not only to an optical device but also to a high-frequency, high-power electronic device, and thus has been actively studied in wide-ranging areas.

In a conventional method to obtain such nitride semiconductor, a sapphire substrate was used to grow a nitride layer thereon. But the sapphire substrate is an insulating material with poor thermal conductivity that can be hardly processed. This disadvantageously complicates a manufacturing process of the device and hinders improvement in capacities thereof. To overcome such problems, the sapphire substrate was removed from the nitride layer via a laser lift off (LLO) process.

Figure 1:
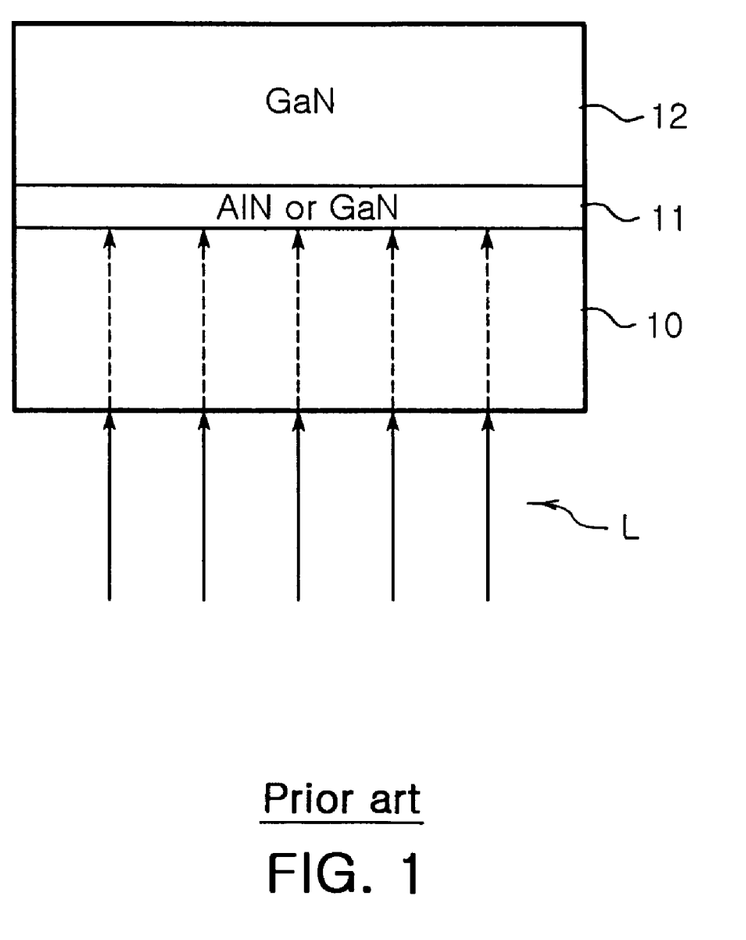
FIG. 1 is a sectional view illustrating a method for manufacturing a nitride layer of the prior art.

FIG. 1 is a sectional view illustrating a method for fabricating a nitride layer via a conventional LLO process. Referring to FIG. 1, in the conventional method to fabricate the nitride layer, first, a buffer layer 11 made of AlN or GaN is formed on a sapphire substrate 10. Then, a nitride layer 12 is grown on the buffer layer 11. Thereafter, a laser beam L is irradiated to an underside of the sapphire substrate 10. The irradiated laser beam transmits the sapphire substrate 10 and decomposes the buffer layer 11, thus enabling separation of the nitride layer 12. That is, in the conventional method to fabricate the nitride layer, the buffer layer 11 serves as a sacrificial layer to separate the nitride layer 12 from the sapphire substrate 10.

In this fashion, due to the buffer layer 11 used as a sacrificial layer in the conventional nitride layer manufacturing method, about 1000° C. heat is transferred to the nitride layer 12, thus deteriorating the nitride layer 12. This disadvantageously degrades physical properties of the nitride layer and also optical and electrical properties.

SUMMARY OF THE INVENTION

The present invention has been made to solve the foregoing problems of the prior art and it is therefore an object of the present invention to provide a method for manufacturing a nitride layer which releases heat generated in the decomposition of the nitride layer through a buffer layer and prevents heat-induced deterioration of the nitride layer by properly adjusting an intensity of a laser beam irradiated in a lift off process to remove the nitride layer at an interface between the nitride layer and the buffer layer.

According to an aspect of the invention for realizing the object, there is provided a method for fabricating a nitride layer comprising steps of:

preparing a sapphire substrate;

forming a buffer layer made of a material having a melting point and a thermal conductivity higher than those of nitride on the sapphire substrate;

forming the nitride layer on the buffer layer; and irradiating a laser beam to an underside of the sapphire substrate to remove the nitride layer.

In a preferred embodiment of the invention, the buffer layer comprises Sic and has a thickness of 2000 Å or less. Also, the nitride layer comprises a material having a composition expressed by $Al_xIn_yGa_{(1-x-y)}N$, where $0 \leq x \leq 1$, $0 \leq y \leq 1$, and $0 \leq x+y \leq 1$.

Preferably, the laser beam irradiating step comprises: irradiating a laser beam having an intensity expressed by an equation below to the underside of the sapphire substrate to remove the nitride layer at the interface between the buffer layer and the nitride layer, $$I = \frac{I_N}{e^{-\alpha Z}}$$

wherein I is an intensity of the irradiated laser beam, $I_N$ is an intensity of the laser beam required to partially decompose the nitride layer, $\alpha$ is an absorption coefficient of the laser beam, and Z is a thickness of the buffer layer.

According to another aspect of the invention for realizing the object, there is provided a method for fabricating a vertical nitride semiconductor light emitting device comprising steps of:

preparing a sapphire substrate;

forming a buffer layer made of SiC on the sapphire substrate;

forming a light emitting structure having an n-type nitride semiconductor layer, an active layer, and a p-type nitride semiconductor layer stacked sequentially on the buffer layer, the n-type nitride semiconductor layer having a composition expressed by $Al_xIn_yGa_{(1-x-y)}N$, where $0 \leq x \leq 1$, $0 \leq y \leq 1$, and $0 \leq x+y \leq 1$;

providing a conductive carrier substrate on the p-type nitride semiconductor layer; and irradiating a laser beam having an intensity expressed by an equation below to an underside of the sapphire substrate to separate the light emitting structure from the sapphire substrate at an interface between the buffer layer and the light emitting structure, $$I = \frac{I_N}{e^{-\alpha Z}}$$

wherein I is an intensity of the irradiated laser beam, $I_N$ is an intensity of the laser beam required to partially decompose the n-type nitride semiconductor layer, $\alpha$ is an absorption coefficient of the laser beam, and Z is a thickness of the buffer layer.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Preferred embodiments of the present invention will now be described in detail with reference to the accompanying drawings in which the reference numerals are used throughout the different drawings to designate the same or similar component.

FIGS. 2a to 2d are process sectional views illustrating in a stepwise fashion a method for manufacturing a nitride layer according to the invention.

Figure 2A:
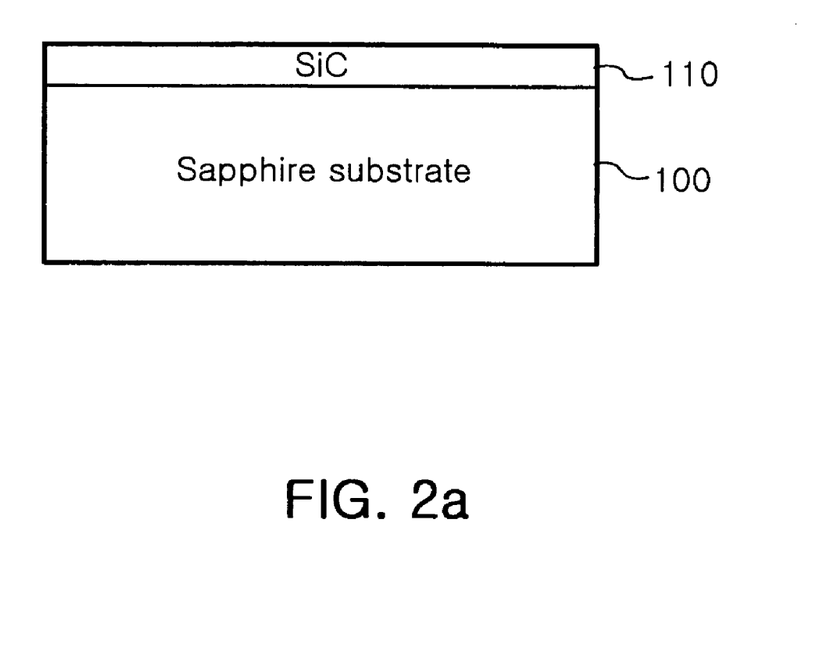
FIGS. 2a to 2d are sectional views illustrating a method for manufacturing a nitride layer of the invention.

First, as shown in FIG. 2a, a sapphire substrate 100 is prepared and a buffer layer 110 is formed on the sapphire substrate 100. Preferably, the buffer layer 110 is made of a material having a melting point higher than that of a material of a nitride layer which will be formed thereon later. In addition, preferably, the buffer layer 110 is made of a material capable of growing a less defective nitride layer thereon, in consideration of differences in lattice constant and thermal expansion coefficient with the nitride layer 110 to be formed on the buffer layer 110. Also, preferably, the buffer layer 110 is made of a material having a thermal conductivity higher than that of the nitride layer to reduce heat transferred to the nitride layer in a following laser lift off process. Given these, preferably, the buffer layer 110 is made of SiC. The SiC can be appropriately employed as a substrate for the growth of the nitride layer due to small differences in lattice constant and thermal expansion coefficient with the nitride layer, and its chemical and physical stability at a temperature of 1500° C. or more. The buffer layer 11 can be formed via a well-known deposition process. Preferably, the buffer layer 110 is formed to a thickness of 2000 Å or less so that a laser beam can be transmitted into an interface with the nitride layer 120.

Figure 2B:
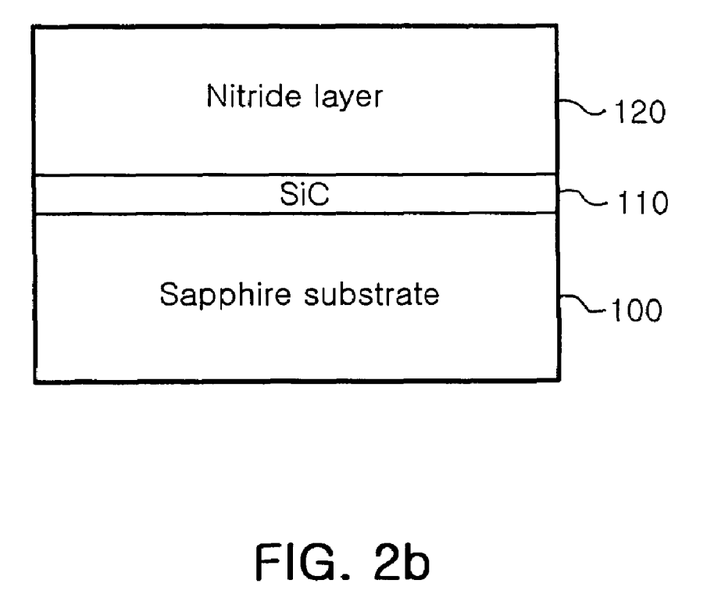

Thereafter, as shown in FIG. 2b, the nitride layer 120 is formed on the buffer layer 110. Preferably, the nitride layer 120 has a composition expressed by $Al_xIn_yGa_{(1-x-y)}N$, where $0 \leq x \leq 1$, $0 \leq y \leq 1$, and $0 \leq x+y \leq 1$. The nitride layer 120 can be formed by conducting Metal Organic Chemical Vapor Deposition (MOCVD), Molecular Beam Epitaxy (MBE) or Hybride Vapor Phase Epitaxy (HVPE) for a material having a composition expressed by $Al_xIn_yGa_{(1-x-y)}N$, where $0 \leq x \leq 1$, $0 \leq y \leq 1$, and $0 \leq x+y \leq 1$.

Figure 2C:
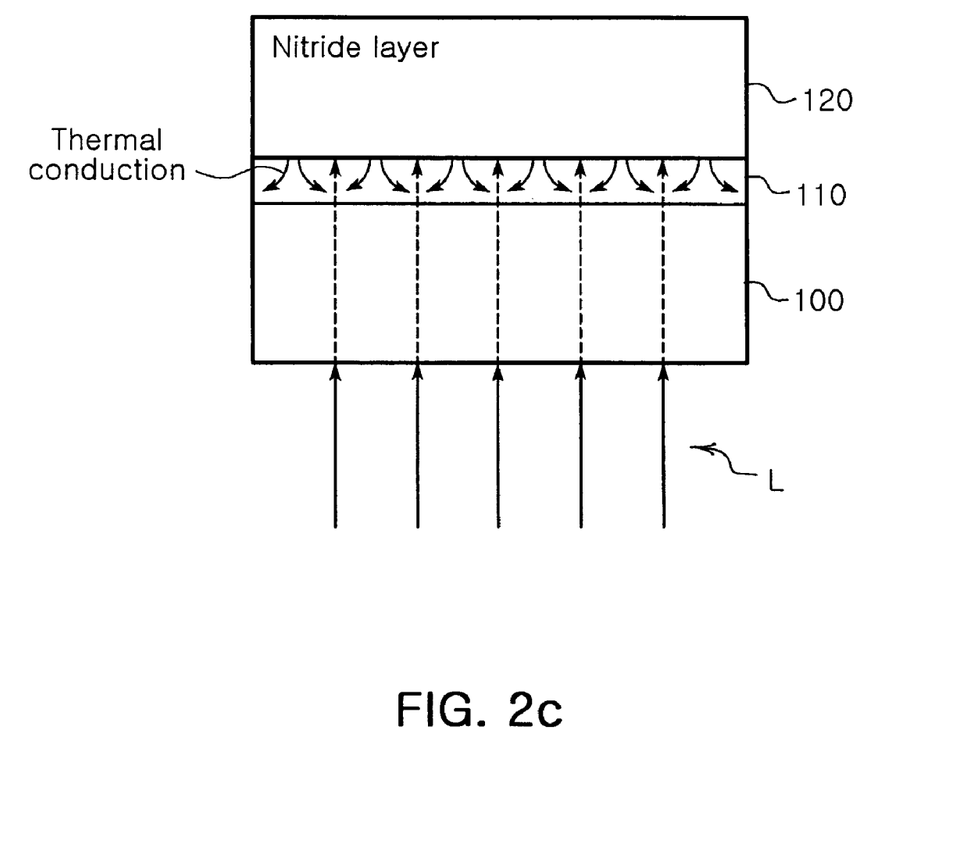

Then, as shown in FIG. 2c, to separate the nitride layer 120 from an underlying structure, a laser beam is irradiated to an underside of the sapphire substrate 100 in a laser lift off process. The laser used this time may be a KrF laser or a Q-switched Nd:YAG laser which has a wavelength transmissive through the sapphire substrate 100 and absorbable into the buffer layer 110 and the nitride layer 120.

In this process, after being transmitted through the sapphire substrate 100 to the buffer layer 110, the laser beam L has an intensity exponentially reduced due to some portions of energy absorbed in passing through the relatively thin buffer layer 110. The laser beam that passes through the buffer layer 110 reaches an interface B between the buffer layer 110 and the nitride layer 120 and decomposes the nitride layer 120 near the interface B.

When a laser beam of intensity I is irradiated, the laser beam that has transmitted the buffer layer 110 with a thickness of Z has an intensity $I_N$ expressed by following Equation 1:

$$I_N = Ie^{-\alpha Z}, \qquad \text{Equation 1}$$

where I is an intensity of the irradiated laser beam, $I_N$ is an intensity of the laser beam required to partially decompose the nitride layer, $\alpha$ is an absorption coefficient of the laser beam, and Z is a thickness of the buffer layer.

That is, the thickness of the laser beam irradiated is exponentially reduced. Employing Equation 1 above, the intensity of the laser beam irradiated to reach the interface between the buffer layer 110 and the nitride layer 120 can be calculated as in Equation 2 below:

$$I = \frac{I_N}{e^{-\alpha Z}}\ldots, \qquad \text{Equation 2}$$

where I is an intensity of a laser beam irradiated, $I_N$ is an intensity of a laser beam necessary for decomposing a nitride layer, $\alpha$ is an absorption coefficient of a laser beam, and Z is a thickness of a buffer layer.

Figure 2D:
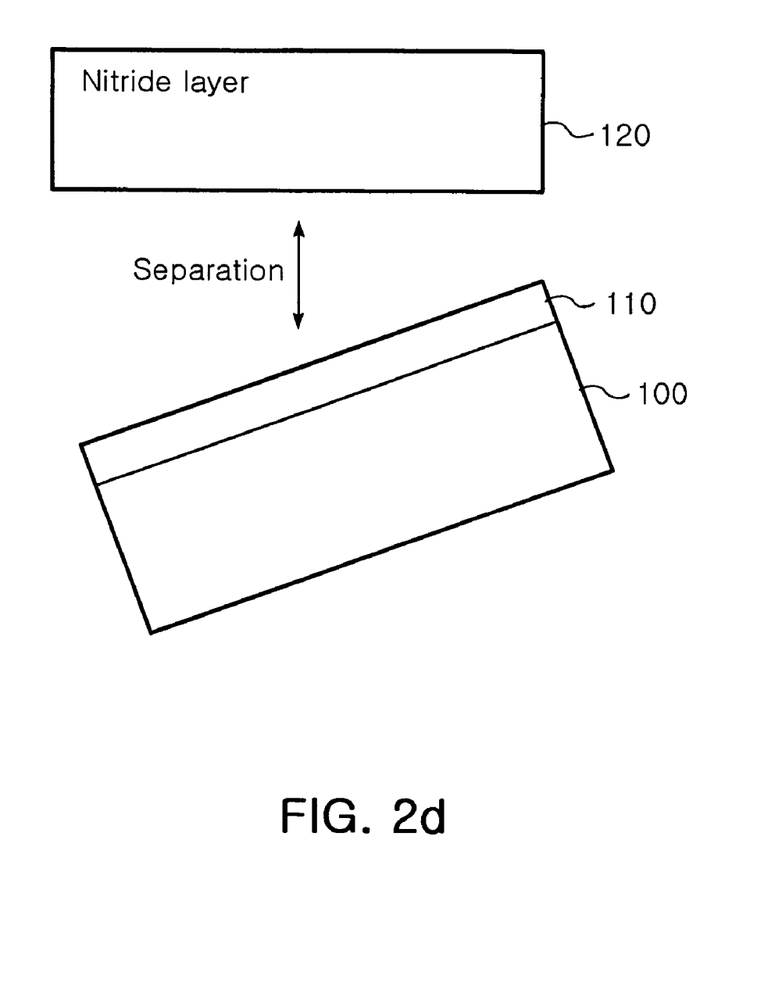

For example, on the assumption that a laser used for a laser lift off process is a Q-switched Nd:YAG laser having an absorption coefficient of about $10^5$/cm and a wavelength of 355 nm, and the nitride layer 120 begins to be decomposed by a laser beam having an intensity of 300 mJ/cm², in the case of a buffer layer with a thickness of 10 nm, the laser beam is irradiated at an intensity of $I = 300/e^{-100000 \times 0.000001} \approx 332$ mJ/cm². As described above, Equation 2 can be used to calculate the intensity of the laser beam that enables separation of the nitride layer 120 at the interface between the buffer layer 110 and the nitride layer 120 as shown in FIG. 2d.

Further, the intensity of the laser beam can be adjusted according to Equation 2 above to ensure separation of the nitride layer at the interface between a buffer layer 110 and a nitride layer 120. In this case, heat generated in separating the nitride layer 120 is transferred to the buffer layer 110 having a high thermal conductivity, thereby preventing quality degradation of the nitride layer 120 caused by thermal conduction into the nitride layer 120.

Figure 3:
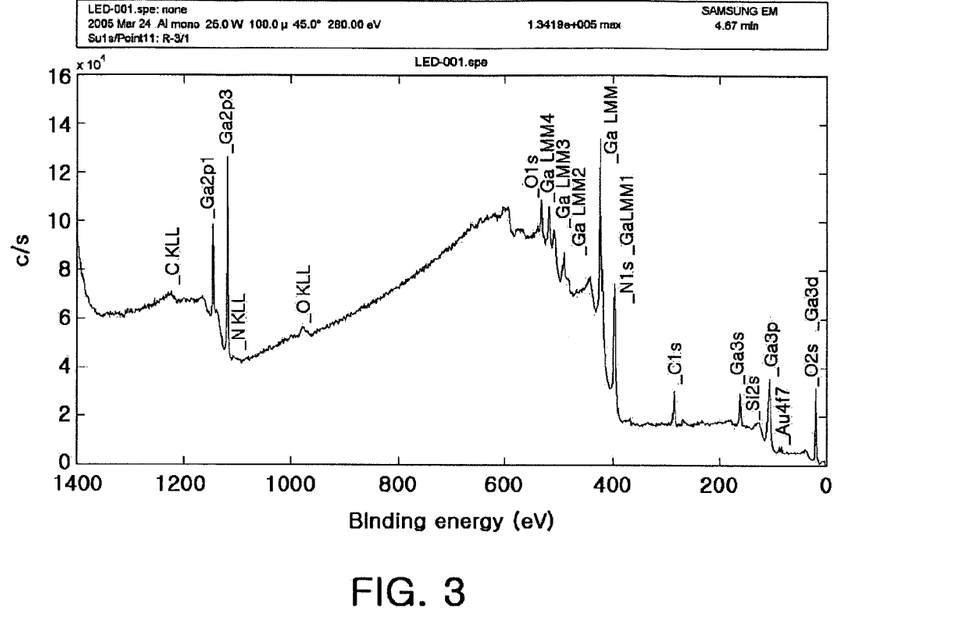
FIG. 3 is a graph illustrating an XPS analysis result for a separated surface of the nitride layer after a laser lift off process according to the invention.

FIG. 3 is a graph illustrating an XPS analysis result for a separated surface of a nitride layer after a laser lift off process according to the invention. At this time, for a buffer layer, SiC was used, and the nitride layer was made of GaN. As shown in FIG. 3, elements such as C, O, N, Ga, Au, and the like were detected on the separated surface except for Si of the buffer layer. This demonstrates that the nitride layer was removed at an interface between the buffer layer and the nitride layer without decomposing the buffer layer made of SiC.

Figure 4:
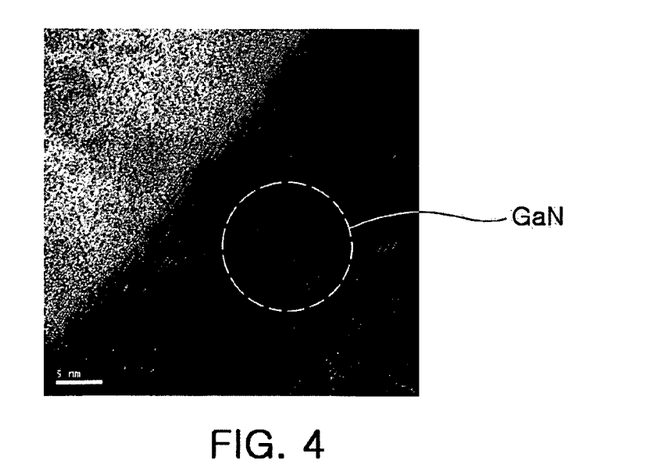
FIG. 4 is a TEM picture illustrating the separated surface of the nitride layer after a laser lift off process according to the invention.

FIG. 4 is a TEM picture illustrating a separated surface of the nitride layer after a laser lift off process according to the invention. As in FIG. 3, for the buffer layer, SiC was used and the nitride layer was made of GaN. As shown in FIG. 4, the lattice of GaN was clearly revealed on the separated surface of the nitride layer. This indicates that the nitride layer was removed at the interface between the buffer layer and the nitride layer without decomposing the buffer layer.

The method for manufacturing the nitride layer according to the invention as described above may be employed to fabricate a bulk nitride substrate. In addition, the manufacturing method of the invention may be used to fabricate a vertical nitride semiconductor light emitting device that requires a process of removing a sapphire substrate. FIGS. 5a to 5f show a method for manufacturing a vertical nitride semiconductor light emitting device according to the invention.

Figure 5A:
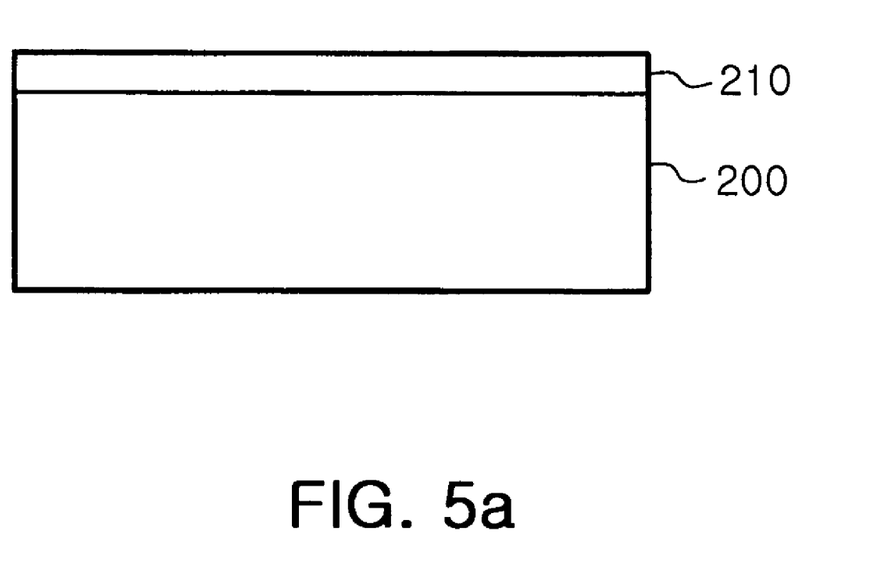
FIGS. 5a to 5f are sectional views illustrating a method for manufacturing a vertical nitride semiconductor light emitting device according to one embodiment of the invention.

First, as shown in FIG. 5a, a sapphire substrate 200 is prepared, and a buffer layer 210 made of SiC is formed on the sapphire substrate 200. The process of forming the buffer layer 210 is the same as stated earlier and thus a detailed explanation thereof will not be given.

Figure 5B:
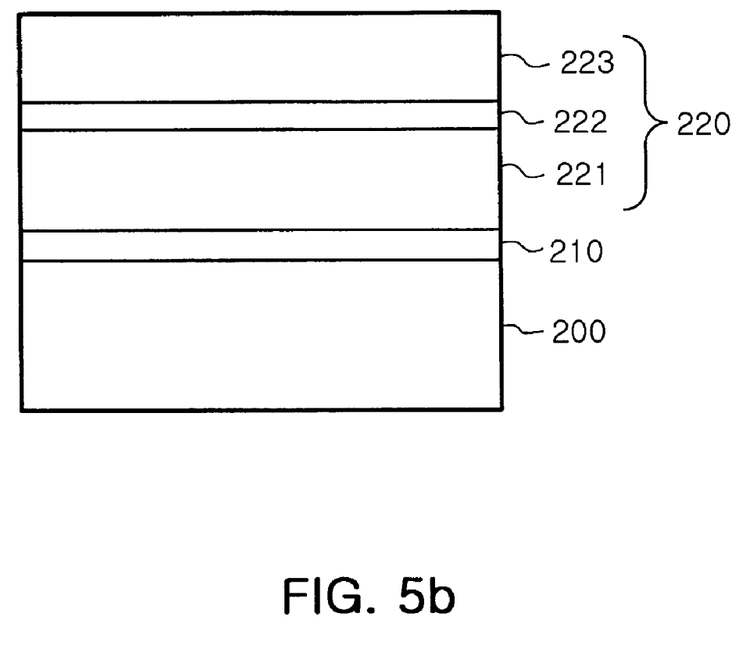

Thereafter, as shown in FIG. 5b, a light emitting structure 220 having an n-type nitride semiconductor layer 221, an active layer 222, and a p-type nitride semiconductor layer 223 stacked sequentially is formed on the buffer layer 210. At this time, the n-type nitride semiconductor layer 221 has a composition expressed by $Al_xIn_yGa_{(1-x-y)}N$, where $0 \leq x \leq 1$, $0 \leq y \leq 1$, and $0 \leq x+y \leq 1$.

The n-type nitride semiconductor layer 221 is made of a semiconductor material doped with impurities of, for example, Si, Ge, Se, Te or C to have a composition expressed by $Al_xIn_yGa_{(1-x-y)}N$, where $0 \leq x \leq 1$, $0 \leq y \leq 1$, and $0 \leq x+y \leq 1$. The n-type nitride semiconductor layer 221 can be grown on the sapphire substrate via a well-known deposition process such as Metal Organic Chemical Vapor Deposition (MOCVD), Molecular Beam Epitaxy (MBE) or Hybride Vapor Phase Epitaxy (HVPE).

The active layer 222, through which light exits, is made of the nitride layer such as GaN or InGaN having a single or multiple quantum well structure. Like the n-type nitride semiconductor layer 221, the active layer 222 is also formed on the n-type semiconductor layer via MOCVD, MBE or HVPE.

Like the n-type nitride semiconductor layer 221, the p-type nitride semiconductor layer 223 is made of a semiconductor material p-doped with impurities of, for example, Mg, Zn, or Be to have a composition expressed by $Al_xIn_yGa_{(1-x-y)}N$, where $0 \leq x \leq 1$, $0 \leq y \leq 1$, and $0 \leq x+y \leq 1$. The p-type nitride semiconductor layer 223 can be grown on the active layer 222 via a well-known deposition process such as MOCVD, MBE or HVPE.

The light emitting structure 220 may further include an undoped nitride semiconductor layer (not illustrated) that is formed on the buffer layer 210 before the forming of the n-type nitride semiconductor layer 221. The undoped nitride semiconductor layer is formed to relieve lattice mismatch.

Figure 5C:
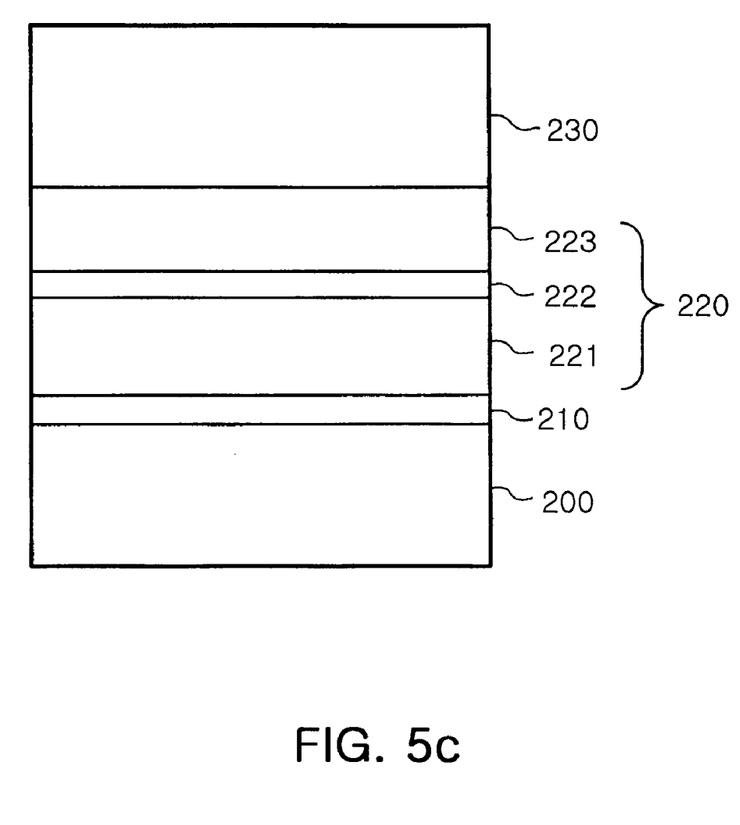

Next, as shown in FIG. 5c, a conductive carrier substrate 230 is formed on the p-type nitride semiconductor layer 223. The conductive carrier substrate 230 may be made of Si or a conductive metal material. The conductive carrier substrate 230 may be bonded onto the p-type nitride semiconductor layer 223 via a separate adhesive layer or plated onto the p-type nitride semiconductor layer 223 to a predetermined thickness by using a platable metal material. In the case of the vertical nitride semiconductor light emitting device, a separated surface of the sapphire substrate in the n-type nitride semiconductor layer 221 is used as a surface where light exits. Therefore a reflective film made of a highly reflective metal may be formed between the p-type nitride semiconductor layer 223 and a conductive carrier substrate 230.

Figure 5D:
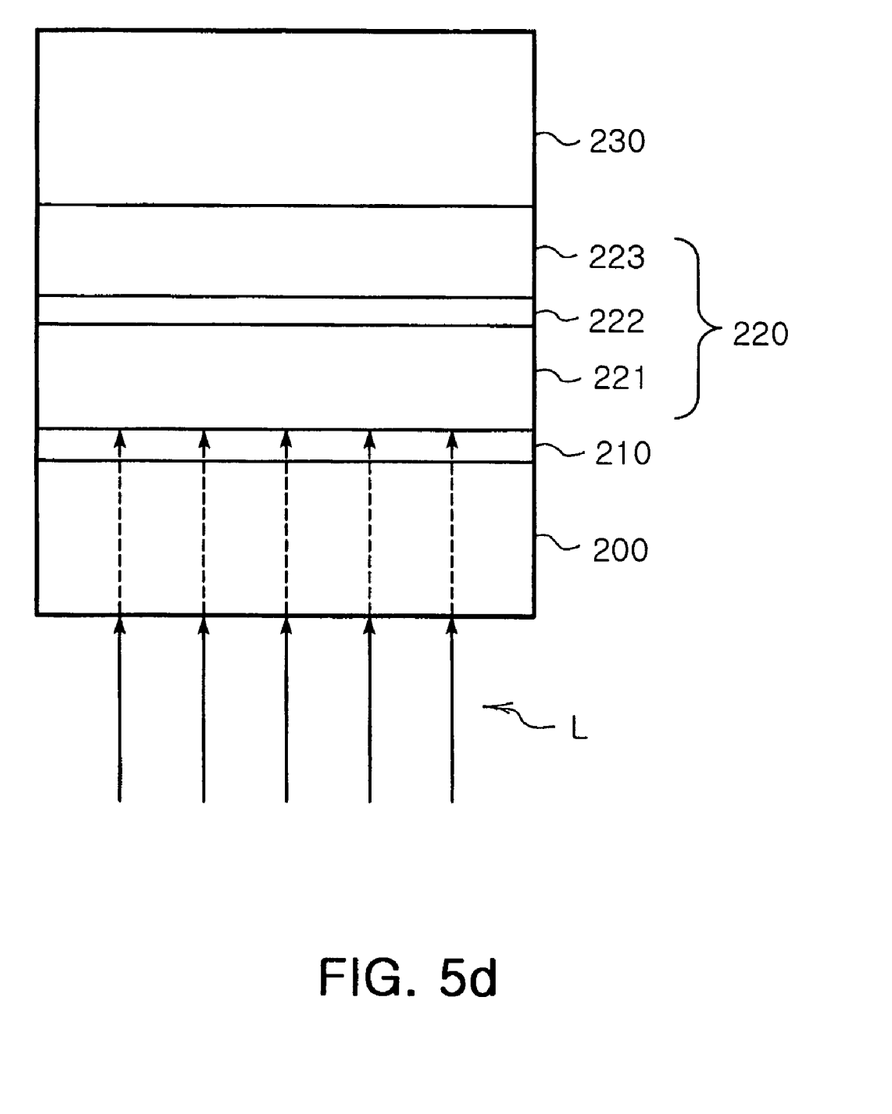
Figure 5E:
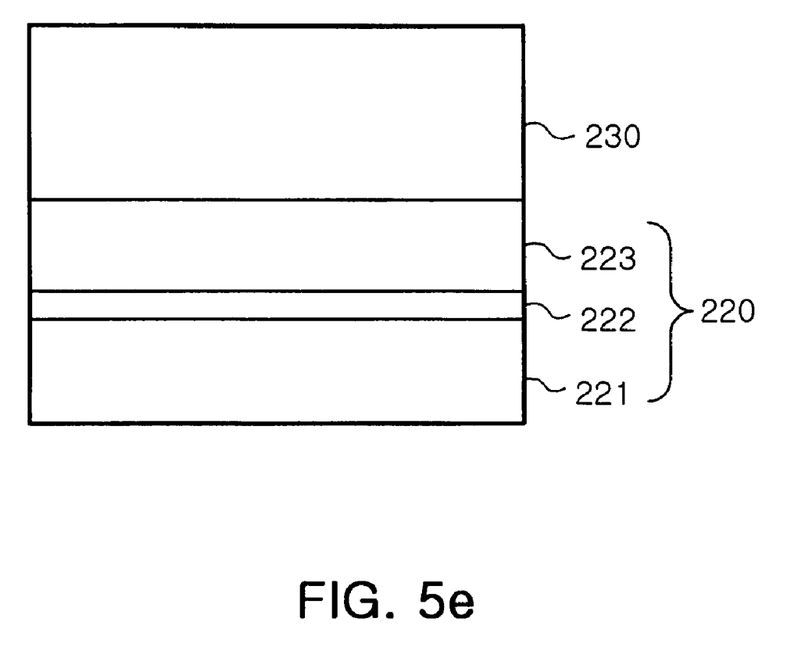

Thereafter, as shown in FIG. 5d, a laser beam is irradiated to an underside of the sapphire substrate 200. This allows the light emitting structure 220 to be separated from the buffer layer 210 at an interface between the buffer layer 210 and the n-type nitride semiconductor layer 221 so that a resultant structure of FIG. 5e is obtained. At this time, the laser beam is irradiated at an intensity according to Equation 2:

$$I = \frac{I_N}{e^{-\alpha Z}}, \ldots, \qquad \text{Equation 2}$$

where I is an intensity of the irradiated laser beam, $I_N$ is an intensity of the laser beam required to partially decompose the n-type nitride semiconductor layer, $\alpha$ is an absorption coefficient of the laser beam, and Z is a thickness of the buffer layer.

An explanation will not be given regarding an intensity and a wavelength of the laser beam that ensures removal of the light emitting structure 220 at the interface between the n-type nitride semiconductor layer 221 and the buffer layer 210 since it has been described earlier with respect to the method for manufacturing the nitride layer.

Meanwhile, in case where the light emitting structure 220 further includes an undoped nitride semiconductor layer (not illustrated) formed underlying the n-type nitride semiconductor layer 221, the separation by laser beam irradiation as described above will occur between the buffer layer 210 and the undoped nitride semiconductor layer.

Figure 5F:
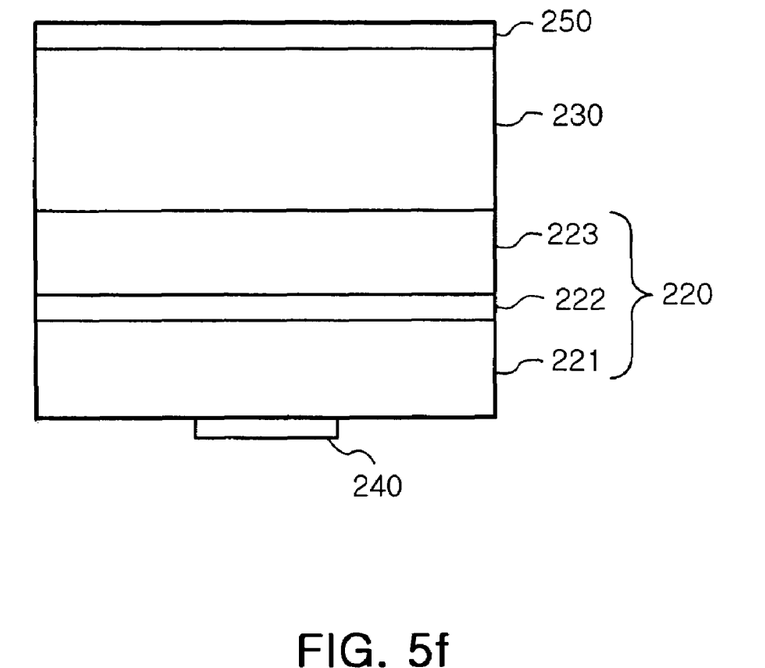

Thereafter, as in FIG. 5f, to complete the vertical nitride semiconductor light emitting device, an n-electrode 240 is formed on an underside of the n-type nitride semiconductor layer 221 after the sapphire substrate is removed. Also, a p-type electrode 250 is formed on the carrier substrate 230. In the vertical nitride semiconductor light emitting device, the underside of the n-type nitride semiconductor layer 221 with the sapphire substrate removed is used as a main light exiting surface. A transparent electrode layer made of ITO may be formed between the n-electrode 240 and the n-type nitride semiconductor layer 221 to improve current spread. Furthermore, in case where the conductive carrier substrate 230 is made of a metal material having excellent electrical conductivity, the carrier substrate 230 itself may be employed as a p-electrode without any need to form a separate p-electrode 250.

In addition, in case where the light emitting structure 220 further includes an undoped nitride semiconductor layer (not illustrated) formed underlying the n-type nitride semiconductor layer 221, the undoped nitride semiconductor layer, after separation of the light emitting structure 220 by laser beam irradiation, is removed via at least one selected from a group consisting of dry-etching, wet-etching, chemical mechanical polishing (CMP) to expose the underside of the n-type nitride semiconductor layer 221. Then, preferably, the n-electrode is formed on the exposed underside of the n-type nitride semiconductor layer 221.

A laser lift off process adopted in the invention ensures a nitride layer to be removed at an interface between a nitride layer and a buffer layer by adjusting an intensity of a laser beam without sacrificing a buffer layer. This allows heat generated during partial decomposition of the nitride layer to exit through the buffer layer, preventing heat-induced degradation of the nitride layer and thus enabling manufacture of the high-quality nitride layer.

As described above, according to the invention, a laser lift off process is employed to remove a sapphire substrate after growing a nitride layer on the sapphire substrate. In this process, an intensity of a laser beam irradiated is properly adjusted to ensure the separation to occur at an interface between the nitride layer and a buffer layer. Thereby, this advantageously allows heat generated during partial decomposition of the nitride layer to exit through the buffer layer, thus preventing heat-induced deterioration of the nitride layer. As a result, the invention advantageously enables manufacture of the high-quality nitride layer and vertical nitride semiconductor light emitting device.

While the present invention has been shown and described in connection with the preferred embodiments, it will be apparent to those skilled in the art that modifications and variations can be made without departing from the spirit and scope of the invention as defined by the appended claims.

What is claimed is:

1. A method for fabricating a nitride layer comprising steps of:
    preparing a sapphire substrate;
    forming a buffer layer made of a material having a melting point and a thermal conductivity higher than those of nitride on the sapphire substrate;
    forming the nitride layer on the buffer layer; and
    irradiating a laser beam to an underside of the sapphire substrate to remove the nitride layer,
    wherein the laser beam irradiating step comprises: irradiating a laser beam having an intensity expressed by an equation below to the underside of the sapphire substrate to remove the nitride layer at an interface between the buffer layer and the nitride layer, $$I = \frac{I_n}{e^{-\alpha Z}}$$

wherein I is an intensity of the irradiated laser beam, $I_N$ is an intensity of the laser beam required to partially decompose the nitride layer, $\alpha$ is an absorption coefficient of the laser beam, and Z is a thickness of the buffer layer.

2. The method according to claim 1, wherein the buffer layer has a thickness of 2000 □ or less.

3. The method according to claim 1, wherein the buffer layer comprises SiC.

4. The method according to claim 1, wherein the nitride layer comprises a material having a composition expressed by $Al_xIn_yGa_{(1-x-y)}N$, where $0 \leq x \leq 1$, $0 \leq y \leq 1$, and $0 \leq x+y \leq 1$.

5. A method for fabricating a nitride layer comprising steps of:
    preparing a sapphire substrate;
    forming a buffer layer made of SiC on the sapphire substrate;
    forming a nitride layer having a composition expressed by $Al_xIn_yGa_{(1-x-y)}N$ on the buffer layer, where $0 \leq x \leq 1$, $0 \leq y \leq 1$, and $0 \leq x+y \leq 1$; and
    irradiating a laser beam having an intensity expressed by an equation below to the sapphire substrate to remove the nitride layer at an interface between the buffer layer and the nitride layer, $$I = \frac{I_n}{e^{-\alpha Z}}$$

wherein I an intensity of the irradiated laser beam, $I_N$ is an intensity of the laser beam required to partially decompose the nitride layer, $\alpha$ is an absorption coefficient of the laser beam, and Z is a thickness of the buffer layer.

6. A method for fabricating a vertical nitride semiconductor light emitting device comprising steps of:
    preparing a sapphire substrate;
    forming a buffer layer made of SiC on the sapphire substrate;
    forming a light emitting structure having an n-type nitride semiconductor layer, an active layer, and a p-type nitride semiconductor layer stacked sequentially on the buffer layer, the n-type nitride semiconductor layer having a composition expressed by $Al_xIn_yGa_{(1-x-y)}N$, where $0 \leq x \leq 1$, $0 \leq y \leq 1$, and $0 \leq x+y \leq 1$;
    providing a conductive carrier substrate on the p-type nitride semiconductor layer; and
    irradiating a laser beam having an intensity expressed by an equation below to an underside of the sapphire substrate to separate the light emitting structure from the sapphire substrate at an interface between the buffer layer and the light emitting structure, $$I = \frac{I_n}{e^{-\alpha Z}}$$

wherein I is an intensity of the irradiated laser beam, $I_n$ is an intensity of the laser beam required to partially decompose the n-type nitride semiconductor layer, $\alpha$ is an absorption coefficient of the laser beam, and Z is a thickness of the buffer layer.

7. The method according to claim 6, further comprising:
    forming an n-electrode on an underside of the n-type nitride semiconductor layer after the sapphire substrate is removed; and
    forming a p-electrode on the carrier substrate.

8. The method according to claim 6, wherein the light emitting structure further comprises an undoped nitride semiconductor layer formed underlying the n-type nitride semiconductor layer.

9. The method according to claim 8, further comprising after the sapphire substrate removing step, removing the undoped nitride semiconductor layer via at least one selected from a group consisting of dry-etching, wet-etching and chemical mechanical polishing.

* * * * *